United States Patent
Prall et al.

(10) Patent No.: US 6,882,003 B2
(45) Date of Patent: Apr. 19, 2005

(54) METHOD AND APPARATUS FOR A FLASH MEMORY DEVICE COMPRISING A SOURCE LOCAL INTERCONNECT

(75) Inventors: Kirk D. Prall, Boise, ID (US); Chun Chen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/668,944

(22) Filed: Sep. 22, 2003

(65) Prior Publication Data

US 2004/0056316 A1 Mar. 25, 2004

Related U.S. Application Data

(62) Division of application No. 10/232,221, filed on Aug. 29, 2002, now Pat. No. 6,624,024.

(51) Int. Cl.[7] .................. H01L 29/788; H01L 21/8247
(52) U.S. Cl. ........................... 257/316; 438/593
(58) Field of Search ................. 257/315–324; 438/593–594

(56) References Cited

U.S. PATENT DOCUMENTS

| | | | |
|---|---|---|---|
| 4,892,840 A | 1/1990 | Esquivel et al. | 437/52 |
| 5,047,981 A | 9/1991 | Gill et al. | 365/185 |
| 5,149,665 A | 9/1992 | Lee | 437/43 |
| 5,270,240 A | 12/1993 | Lee | 437/52 |
| 5,339,279 A | 8/1994 | Toms et al. | 365/185 |
| 5,357,476 A | 10/1994 | Kuo et al. | 365/218 |
| 6,060,346 A | 5/2000 | Roh et al. | 438/200 |
| 6,083,828 A | 7/2000 | Lin et al. | 438/639 |
| 6,103,608 A | 8/2000 | Jen et al. | 438/592 |
| 6,174,774 B1 | 1/2001 | Lee | 438/279 |
| 6,235,593 B1 | 5/2001 | Huang | 438/279 |
| 6,235,619 B1 | 5/2001 | Miyakawa | 438/585 |
| 6,261,968 B1 | 7/2001 | Lee | 438/734 |
| 2003/0054623 A1 | 3/2003 | Weimer et al. | 438/587 |

*Primary Examiner*—Richard A. Booth
(74) *Attorney, Agent, or Firm*—Kevin D. Martin (57) ABSTRACT

A method for forming a flash memory device having a local interconnect connecting source regions of a plurality of transistors within a sector allows for a highly-selective wet etch of a dielectric region overlying the source region. An embodiment of the method comprises the use of an etch-resistant layer covering various features such as any gate oxide remaining over the source region, spacers along sidewalls of the transistor stacks, and a capping layer of the transistor. An in-process semiconductor device resulting from the inventive method is also disclosed.

11 Claims, 8 Drawing Sheets

METHOD AND APPARATUS FOR A FLASH MEMORY DEVICE COMPRISING A SOURCE LOCAL INTERCONNECT

This is a division of U.S. Ser. No. 10/232,221 filed Aug. 29, 2002 and issued Sep. 23, 2003 as U.S. Pat. No. 6,624,024.

FIELD OF THE INVENTION

This invention relates to the field of semiconductor manufacture and, more particularly, to a method and structure for a source local interconnect for a flash memory device.

BACKGROUND OF THE INVENTION

Floating gate memory devices such as flash memories include an array of electrically-programmable and electrically-erasable memory cells. Typically, each memory cell comprises a single n-channel metal oxide semiconductor (NMOS) transistor including a floating gate interposed between a control (input) gate and a channel. A layer of high-quality tunnel oxide used as gate oxide separates the transistor channel and the floating gate, and an oxide-nitride-oxide (ONO) dielectric stack separates the floating gate from the control gate. The ONO stack typically comprises a layer of silicon nitride ($Si_3N_4$) interposed between underlying and overlying layers of silicon dioxide ($SiO_2$). The underlying layer of $SiO_2$ is typically grown on the first doped polycrystalline silicon (polysilicon) layer. The nitride layer is deposited over the underlying oxide layer, and the overlying oxide layer can be either grown or deposited on the nitride layer. The ONO layer maximizes the capacitive coupling between the floating gate and the control gate and minimizes the leakage of current.

To program a flash cell, the drain region and the control gate are raised to predetermined potentials above a potential applied to the source region. For example 12, volts are applied to the control gate, 0.0 volts are applied to the source, and 6.0 volts are applied to the drain. These voltages produce "hot electrons" which are accelerated from the substrate across the gate oxide layer to the floating gate. Various schemes are used to erase a flash cell. For example, a high positive potential such as 12 volts is applied to the source region, the control gate is grounded, and the drain is allowed to float. More common erase bias conditions include: a "negative gate erase" in which −10V is applied to the control gate ($V_g$), 6V is applied to the source ($V_s$), a potential of 0V is applied to the body ($V_{body}$), and the drain is allowed to float ($V_d$); and a "channel erase" which comprises a $V_g$ of −9V, a $V_{body}$ of 9V, and a $V_s$ and $V_d$ of 9V or floating. In each case these voltages are applied for a timed period, and the longer the period the more the cell becomes erased. A strong electric field develops between the floating gate and the source region, and negative charge is extracted from the floating gate across the tunnel oxide to the source region, for example by Fowler-Nordheim tunneling.

In a flash memory device, the sources associated with each transistor within a sector are tied together, typically through the use of conductive doping of the wafer to connect the sources of each transistor within a column. The columns within the sector are tied together using conductive plugs and a conductive line.

Figure 1:
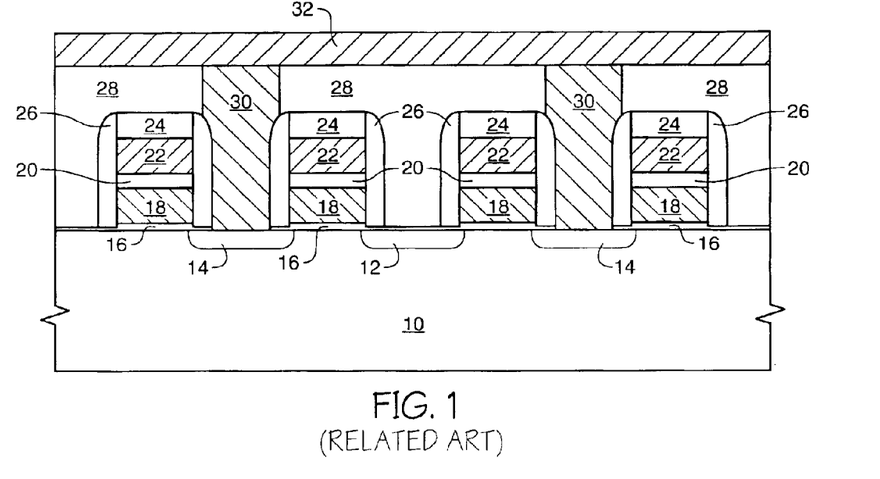
FIG. 1 is a cross section depicting an arrangement of transistors, digit lines, and a source diffusion region formed as part of a conventional device.

FIG. 1 depicts a cross section of a transistor and other structures of a conventional flash electrically-erasable programmable read-only memory ($E^2$PROM) device. FIG. 1 depicts the following structures: semiconductor substrate assembly comprising a semiconductor wafer 10, transistor source 12 and drain 14 diffusion regions within semiconductor wafer 10, gate (tunnel) oxide 16, floating gates 18 typically comprising a first polysilicon layer, capacitor dielectric 20 typically comprising an oxide-nitride-oxide (ONO) stack, control gate (word line) 22 typically comprising a second polysilicon layer, a transistor stack capping layer 24 typically comprising silicon nitride ($Si_3N_4$) or tetraethyl orthosilicate (TEOS), oxide or nitride spacers 26, a planar dielectric layer 28 such as borophosphosilicate glass (BPSG), digit line plugs 30 connected to drain regions 14, and a conductive line 32 typically comprising aluminum which electrically couples each plug 30 within a row of transistors.

A goal of design engineers is to increase the density of the transistors to enable a decrease in the size of the semiconductor device. One way this can be accomplished is to decrease the size of the transistors. As a semiconductor die typically comprises transistors numbering in the millions, even a small decrease in the transistor size can result in a marked improvement in device density. One obstacle to decreasing the transistor size is that if the cross-sectional area of the source region 12 becomes too small the electrical resistance of the source diffusion region increases beyond a desirable level and the device may become unreliable. The undesirable increase in resistance is exacerbated by the relatively extreme length of the diffusion region which functions as a source region for all transistors within a column. Thus, to minimize the resistance the source region must be heavily doped with conductive atoms. One problem with providing a heavily doped source region is that the dopants tend to diffuse away from the source region, especially with high-temperature processing of subsequent manufacturing steps. The dopants can migrate into the channel region of the device thereby effectively decreasing the channel length interposed between the source and drain regions underneath the transistor stack. This decrease in channel length can produce problems known as "short channel effects" such as a transistor with a lowered threshold voltage, which itself can produce an unreliable device.

Figure 2:
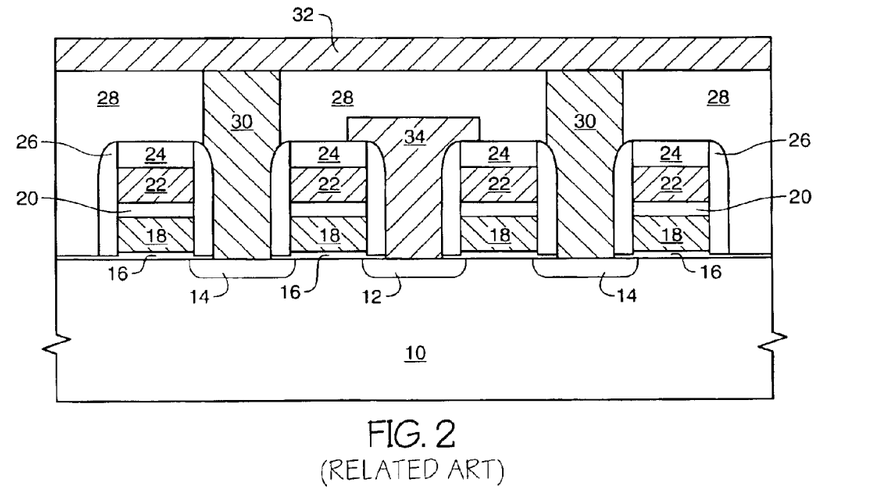
FIG. 2 is a cross section depicting an arrangement of transistors, digit lines, and a source local interconnect formed as part of a conventional device.

One method for allowing a decrease in transistor size by decreasing the source length which avoids short channel effects is to provide a source local interconnect (LI) 34 as depicted in FIG. 2. A source LI can comprise the use of a conductive interconnect which electrically couples each source in one column of transistors of a flash device with all other sources. The interconnect is typically formed from a single layer of patterned, conductively-doped polysilicon, a metal such as tungsten, or another conductive material lying between two adjacent columns of transistors. An LI of polysilicon and a method for forming the LI has been proposed by R. Lee in U.S. Pat. Nos. 5,149,665 and 5,270,240, each of which is assigned to Micron Technology, Inc. and incorporated herein by reference as if set forth in their entirety.

One concern with source local interconnects is to maintain an adequate isolation between the interconnect and the word lines (control gates) of each adjacent transistor to prevent shorting and to sustain the maximum voltage between the source and control gate of the flash device. For example, in program (write) mode, 12 volts can be applied to the control gate while 0 volts is applied to the source. While maintaining isolation is necessary, an attempt is made to keep the spacing between the LI and the word lines to a minimum so that the transistors, and thus the memory array, can be made as small as possible.

A method for forming a local interconnect for a semiconductor device, and an inventive structure resulting from the method, which reduces or eliminates the problems described above would be desirable.

SUMMARY OF THE INVENTION

The present invention provides a new method for forming a semiconductor device, and an inventive semiconductor device resulting from the method, which, among other advantages, allows for a more scaleable device than is found with flash memory devices having diffused sources. The inventive method and device further allows for minimal spacing between a local interconnect and adjacent transistor features.

In accordance with one embodiment of the invention a plurality of transistor stacks each having an associated source and drain region, a nitride capping layer, and nitride spacers formed along each stack is provided. During the etch of the transistor stacks the gate oxide is typically not completely removed from the source and drain regions and remains until later processing steps and protects the silicon wafer in the source/drain areas. A thin blanket nitride barrier layer is then formed over exposed surfaces. Next, a planarized blanket layer of borophosphosilicate glass (BPSG) is formed, and a blanket nitride layer is formed over the BPSG layer. A patterned photoresist layer is formed over the blanket nitride layer which has an opening therein located over the transistor sources. The nitride overlying the BPSG layer and the BPSG layer are etched using an anisotropic etch to keep sidewalls defined by the nitride and BPSG formed as nearly vertical as possible. During this etch the BPSG is only partially etched to leave a portion over the source region.

Next, the photoresist layer is removed and a blanket conformal nitride layer is formed and spacer etched to form nitride spacers along the BPSG sidewalls. After forming the spacers the BPSG remaining over the source regions is removed using a wet etch which is highly selective to nitride relative to BPSG such that very little of the nitride barrier layer is removed. As all exposed surfaces except for the BPSG to be removed are covered by the thin nitride barrier layer, the nitride spacers, or the nitride layer overlying the BPSG, a highly-selective wet etch can be used which has a high BPSG:nitride etch rate, rather than a dry etch which is much less selective between BPSG and nitride. A wet etch is avoided, for example to avoid etching the BPSG or damaging the tunnel oxide which is exposed with conventional processing. Subsequently, the thin nitride barrier layer and the remaining gate oxide over the source region is etched, and a conductive local interconnect layer is formed within the opening defined by the nitride to contact the source regions, for example using a damascene process. Finally, a contact and interconnect to the source local interconnect is provided.

In accordance with another embodiment of the invention, a plurality of transistor stacks each having an associated source and drain region, a nitride capping layer, and nitride spacers formed along each stack is provided. During the etch of the transistor stacks the gate oxide is typically not completely removed from the source and drain regions and remains until later processing steps and protects the silicon wafer in the source/drain areas. A thin blanket nitride barrier layer is then formed over exposed surfaces, and a BPSG layer is formed and planarized. While the BPSG is being planarized, it is possible to remove the thin nitride barrier layer from over the nitride capping layer, as well as part of the nitride capping layer itself. Next, a patterned photoresist layer is formed over the BPSG layer which leaves exposed a BPSG portion overlying the source regions. A wet etch is used to remove the exposed BPSG down to the thin nitride barrier layer, then the nitride barrier is etched to expose the source regions. A source local interconnect is formed, for example using a damascene process, then wafer processing continues.

An in-process device formed in accordance with one embodiment of the invention comprises at least two columns of transistors within a single sector of a memory device, with each transistor having a source region. A dielectric layer having an opening therein defined by first and second dielectric sidewalls is formed over the transistors, with one sidewall overlying each column of transistors. The device further comprises: first and second dielectric spacers, wherein each of the spacers covers one sidewall of the dielectric layer; and a conductive line partially formed between the two columns of transistors and partially formed in the opening in the dielectric layer between the first and second dielectric sidewalls, wherein the spacers separate the conductive line from physical contact with the dielectric layer, and wherein the conductive line electrically couples each source region of each transistor in each of the two columns of transistors.

Use of this process allows for a more easily controlled exposure of the source regions using a wet etch while protecting the gate oxide and other features from the etch. Thus the nitride spacers along the transistor stacks and along the BPSG layer can be formed to be very thin and the distance between the stacks themselves can be formed to be very narrow because of the controllable wet etch which is used to expose the source region and the thin nitride barrier layer used to protect various features from the wet etch.

Additional advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

A first embodiment of an inventive method for providing a flash memory device comprising a source local interconnect is depicted in FIGS. 3–12. The structure of FIG. 3, or a similar structure, is formed to comprise the following: a semiconductor wafer 10, implanted transistor source 12 and drain 14 diffusion regions, gate oxide 16, floating gates 18, capacitor dielectric 20, control gates 22, and a capping layer 24, for example comprising silicon nitride ($Si_3N_4$). While four transistor stacks comprising layers 16–24 are depicted, it is conventional that a transistor array comprising several million transistors will be located over the surface of wafer 10.

The source regions 12 can comprise an arsenic-doped or phosphorous-doped well implanted in the wafer to an implant level of between about 1E13 to about 1E15 atoms/$cm^2$. This is different from conventional flash devices which have a source implant level of greater than 1E15 up to about 1E16 atoms/$cm^2$. The lighter doping concentration of the inventive source region allows the distance between source and drain regions to be decreased. This decrease in spacing between source and drain regions allowed by this embodiment of the present invention results, in part, from the reduction of the number of implanted atoms diffusing away from the high concentration regions of conventional source regions into the channel region below the transistor stack. The remainder of the FIG. 3 structure can be manufactured by one of ordinary skill in the art from the information herein for a flash device.

Figure 3:
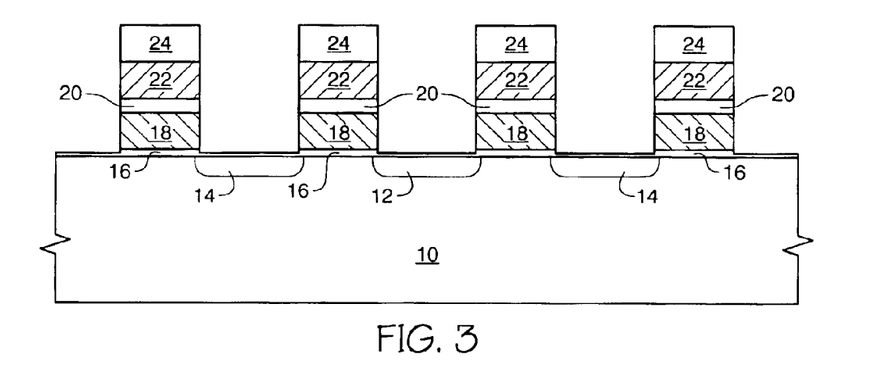
FIGS. 3–12 are cross sections depicting a first inventive embodiment of a method to form a source local interconnect.
Figure 4:
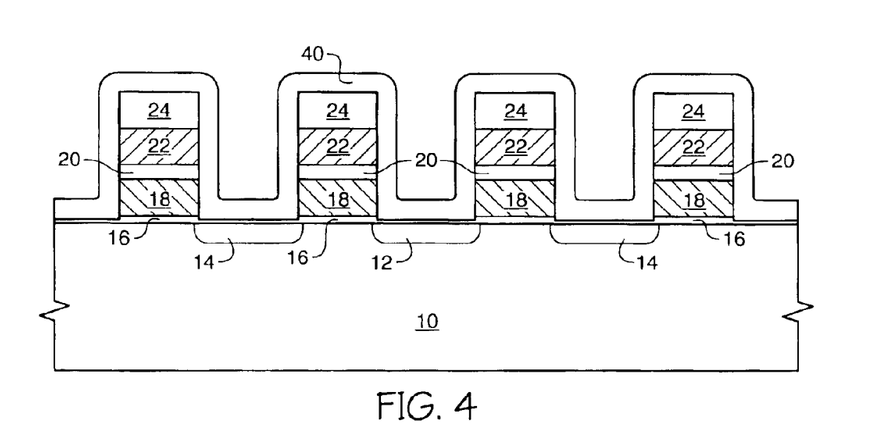
Figure 5:
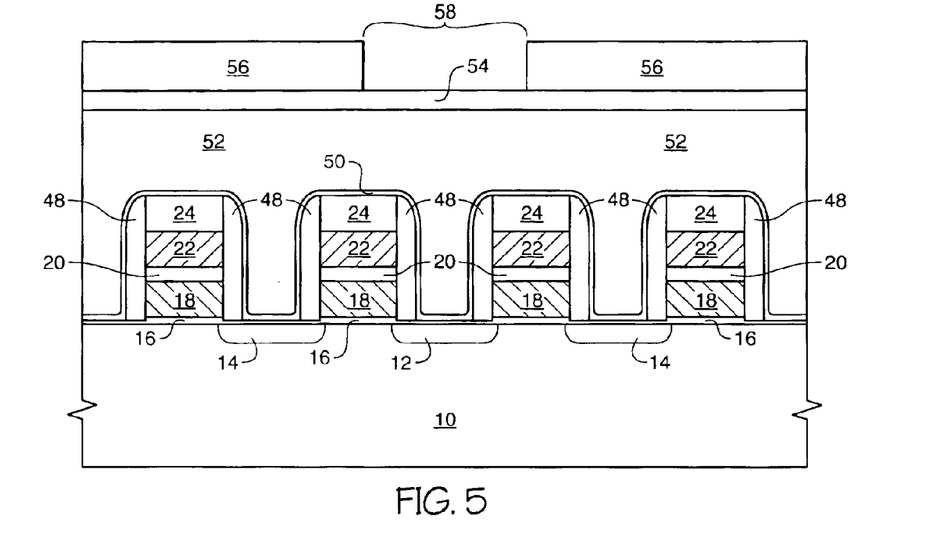

After forming the FIG. 3 structure, a blanket spacer layer 40, for example a layer of silicon nitride, is formed over exposed surfaces of the wafer assembly as depicted in FIG. 4. A $Si_3N_4$ layer between about 500 angstroms (Å) and about 1,000 Å thick would be sufficient. Such a layer can be formed by various chemical vapor deposition (CVD) processes, such as by introducing dichlorosilane gas (DCS, $SiCl_2H_2$) at a flow rate of about 90 standard $cm^3$/minute (sccm) into a CVD deposition chamber along with about 270 sccm ammonia ($NH_3$) at about 600° C. for between about 30 minutes and about 90 minutes. After forming blanket layer 40, it is etched using an anisotropic spacer etch to form nitride spacers 48 as depicted in FIG. 5. A sufficient spacer etch uses an argon plasma comprising argon at a flow rate of about 20 sccm, carbon tetrafluoride ($CF_4$) at a flow rate of about 90 sccm, a radio frequency (RF) power of about 350 watts, a pressure of about 30 millitorr (mT) a temperature of about 20° C., and an etch time of between about 30 to about 60 seconds. The spacers 48 are located over the gate oxide 16, and the gate oxide remains exposed after formation of spacers 48.

After forming nitride spacers 48, a thin blanket etch-resistant layer 50, such as a layer of silicon nitride between about 50 Å and about 100 Å thick, is formed according to techniques known in the art. Layer 50 covers all exposed features, but in particular covers the exposed gate oxide 16. Subsequently, a blanket planarized dielectric layer such as borophosphosilicate glass (BPSG) 52 is formed over the wafer surface. The wafers can be processed at between about 350° C. and about 400° C. in a chemical vapor deposition (CVD) furnace in an environment comprising silane ($SiH_4$), oxygen, phosphine ($PH_3$), and diborine ($B_2H_6$) for a target BPSG thickness of between about 2,000 Å and about 20,000 Å. The BPSG layer can then be planarized using a reflow process, for example by processing the wafers at a temperature of about 900° C. for about 25 seconds, then processed with an abrasive planarization technique such as chemical mechanical planarization (CMP) to ensure a sufficiently planar surface.

Subsequent to forming BPSG 52, a protective layer 54, for example an $Si_3N_4$ layer is formed over the surface of the BPSG layer 52. A nitride layer having a target thickness of between about 200 Å and about 500 Å can be formed by introducing 90 sccm DCS and 270 sccm $NH_3$ into a low pressure chemical vapor deposition (LPCVD) furnace at a temperature of between about 550° C. and about 650° C. for between about 30 minutes and about 60 minutes.

A patterned photoresist layer 56 is formed over the surface of the nitride 54 such that an opening 58 in the photoresist 56 is above a location overlying the source region 12 as depicted in FIG. 5.

Figure 6:
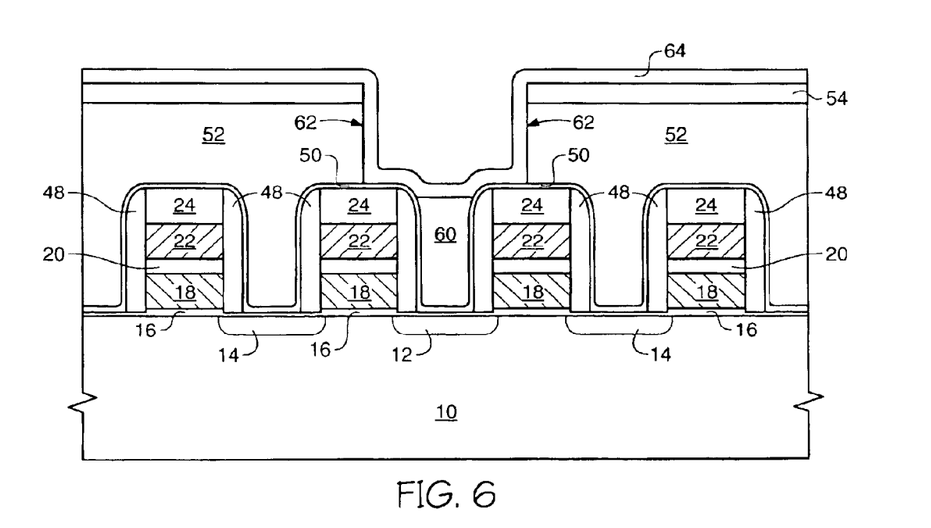

After forming the FIG. 5 structure, an opening is etched in the protective layer 54, then the BPSG 52 is etched such that a portion 60 of the dielectric 52 remains over the source region 12 as depicted in FIG. 6. The etch of protective layer 54 and BPSG 52 can be performed using a single etch, but it is preferably etched using two different etch chemistries. For example, a nitride etch can comprise about 20 sccm argon, about 90 sccm $CF_4$, an RF power of about 350 watts, a pressure of about 30 mT, a temperature of about 20° C., and a duration of about 20–40 seconds, and the BPSG etch can comprise about 70 sccm $CHF_3$, about 20 sccm $CH_2F_2$, and about 50 sccm argon, for a duration of about two minutes. Regardless of whether the nitride and BPSG are etched using the same etch or two different etches, the etch or etches are selected to remove the protective layer and the BPSG layer such that vertical or near vertical sidewalls 62 are formed in the BPSG layer 52 as depicted. As shown in FIG. 6, this etch is timed to ensure that a portion of the dielectric 60 remains to cover the source region 12. In particular, the top of layer 60 should be recessed below the top of capping layer 24 between about 10% and about 50% of the thickness of capping layer 24, and should preferably be recessed between about 25% and about 50% of the thickness of capping layer 24.

Figure 7:
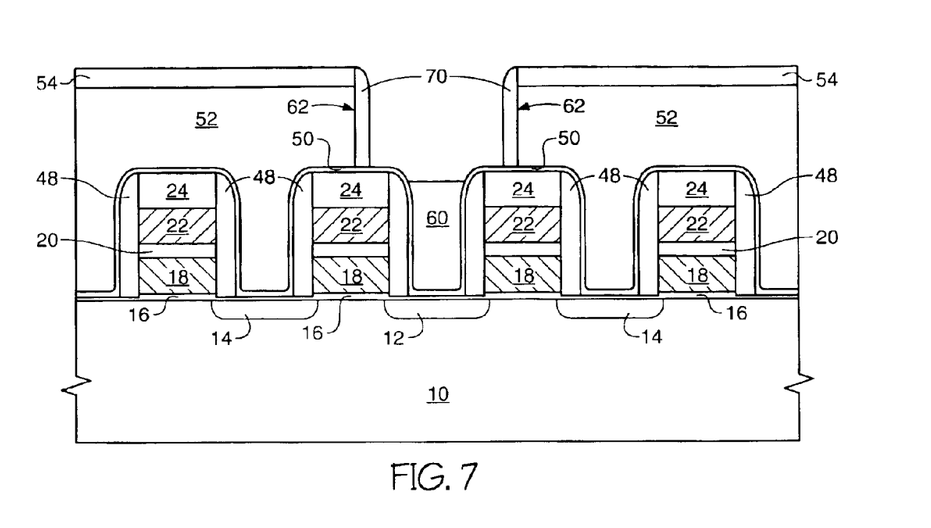
Figure 8:
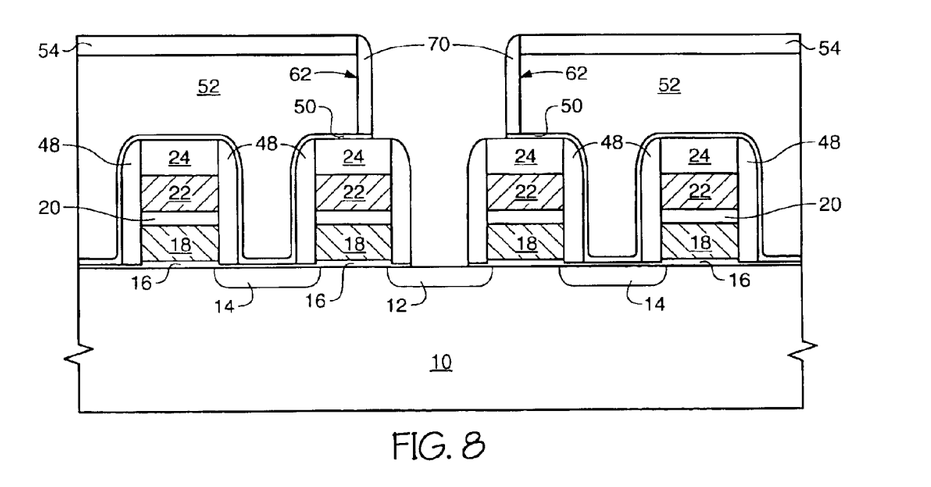

After forming sidewalls 62 in dielectric layers 52 and 54 the photoresist layer 56 is removed and a blanket conformal spacer layer 64 is formed, for example a layer of silicon nitride, as depicted in FIG. 6. This layer can be formed using a process similar to that described above to form layer 54, having a target thickness of between about 50 Å and about 300 Å. After forming blanket spacer layer 64, an anisotropic spacer etch is performed to form spacers 70 over the sidewalls 62 of dielectric 52 and 54 as depicted in FIG. 7.

Subsequently, a wet etch is performed to remove the portion of dielectric 60 covering source regions 12. A wet etch such as hydrofluoric acid (HF) diluted to about 25:1 water:HF for between about five minutes and about 10 minutes is selected because a wet etch, in general, provides for much higher BPSG etch rate relative to the nitride capping layer 24, protective layer 54, etch-resistant layer 50, and spacers 48, 70. Layers 24, 54, 50, 48, and 70 protect the BPSG layer which is to remain, and allow the wet etch to completely remove dielectric portion 60 to expose the source region 12. Layer 50 in particular protects the portion of gate oxide 16 underlying spacers 48 which would be exposed without layer 50, and prevents erosion of the gate oxide 16 from under spacers 48. The wet etch described removes BPSG selective to nitride, and thus the source region, and more particularly the silicon wafer 10 into which the source region 12 is formed, is not damaged by an over etch once layer 60 has been completely removed as it is protected by layer 50. After etching the BPSG and stopping on nitride protective layer 50, layers 50 and 16 which cover source region 12 are etched using an anisotropic dry etch. An etch which removes nitride and oxide selective to the silicon wafer includes $CHF_3$, $CH_2F_2$, and argon plasma gas. After etching layers 60, 50, and 16 over the source region 12 of FIG. 7, the structure of FIG. 8 remains.

Figure 9:
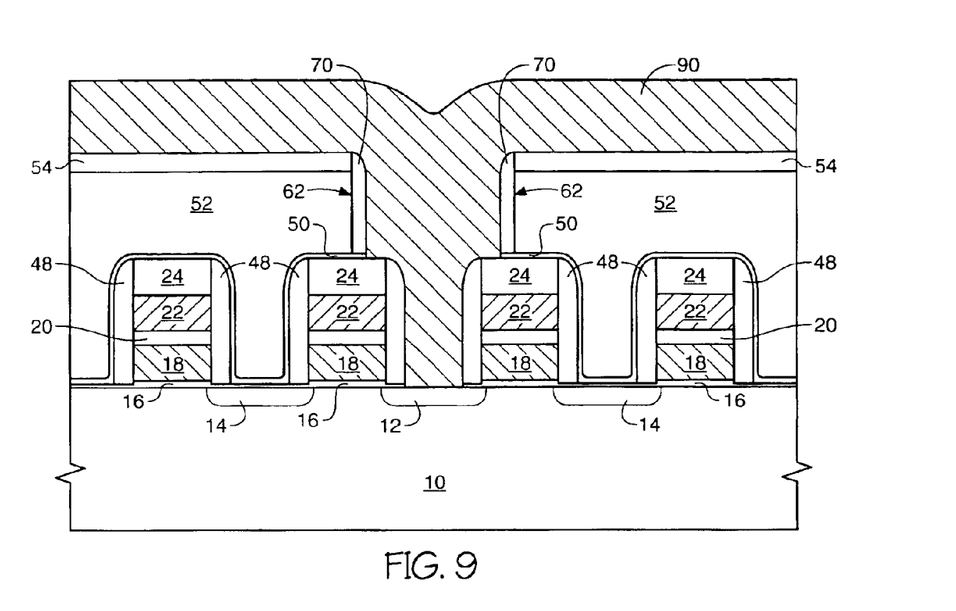

Next, a blanket conductive local interconnect layer is formed, for example from polysilicon 90, to result in the structure of FIG. 9. A layer of conductively-doped polysilicon between about 500 Å and about 2,000 Å may be formed by introducing silane gas (SiH$_4$) as a silicon source into the chamber at a flow rate of between about 400 sccm and about 600 sccm along with phosphine (PH$_3$) at a flow rate of between about 5 sccm and about 15 sccm at a temperature of between about 500° C. and about 600° C. for a duration of between about four hours and about 16 hours. Using this process the preferred material is formed at a rate of between about 10 Å/min to about 20 Å/min. While polysilicon is preferred and is used in the description below, other materials such as tungsten may be used. The description below for polysilicon can be modified easily by one of ordinary skill in the art for the specific material used.

Figure 10:
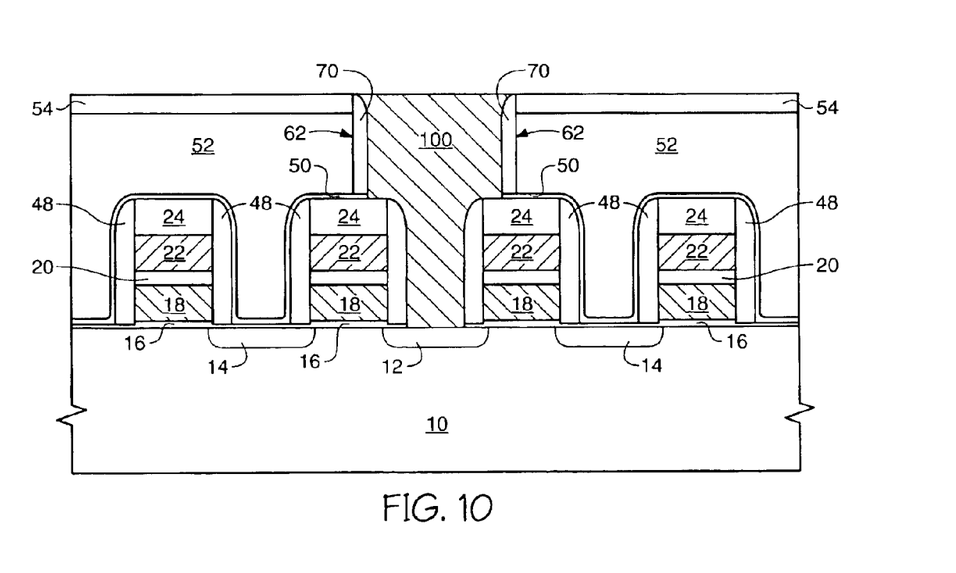

The interconnect layer 90 is planarized, for example using an abrasive planarization technique such as CMP, to result in the damascene planarized polysilicon line 100 of FIG. 10. At this point the conductive line electrically connects together the source regions for all the transistors along a column of transistors. In this embodiment, the sources for each transistor are connected using the source LI and are otherwise separated by field oxide or shallow trench isolation (STI) oxide. In certain designs of flash devices, the local interconnect will electrically connect the source regions for all the transistors along two adjacent columns of transistors.

Figure 11:
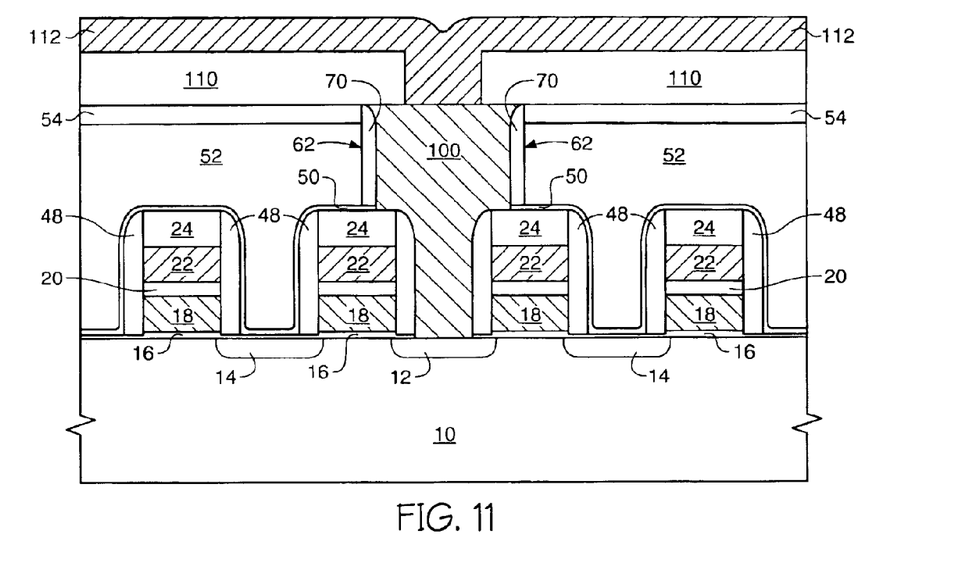
Figure 12:
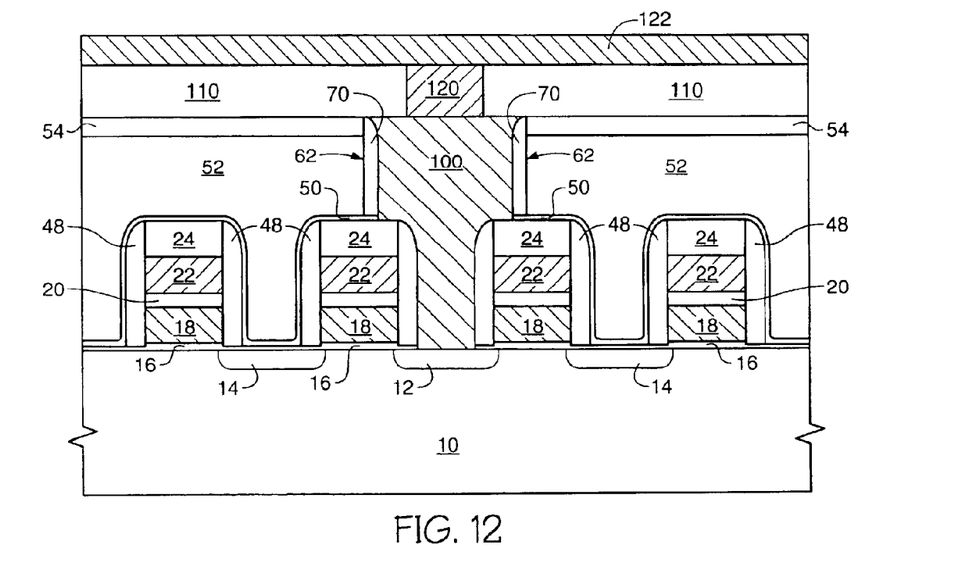

After electrically coupling all the sources within a column (or two columns) of transistors with polysilicon line 100, multiple conductive lines can be connected to electrically couple all source regions within a sector. This can be accomplished by forming a patterned dielectric layer 110 having an opening which exposes polysilicon line 100 at least at one location as depicted in FIG. 11, or at multiple locations to reduce electrical resistance through a single plug embodiment. A blanket conductive layer 112, for example tungsten, is formed to fill the opening in layer 110. Layer 110 is then planarized to form a plurality of conductive plugs 120 in layer 110, one of which is depicted in FIG. 12. At least one plug 112 contacts each conductive line 100 which couples a plurality of source regions in a column of transistors. Next, a conductive line 122, for example aluminum, is patterned to contact plugs 120 across multiple columns of transistors within a sector to electrically couple the polysilicon lines 100 across multiple columns of transistors, and thus electrically couple each source line within multiple columns of transistors of a sector.

Figure 13:
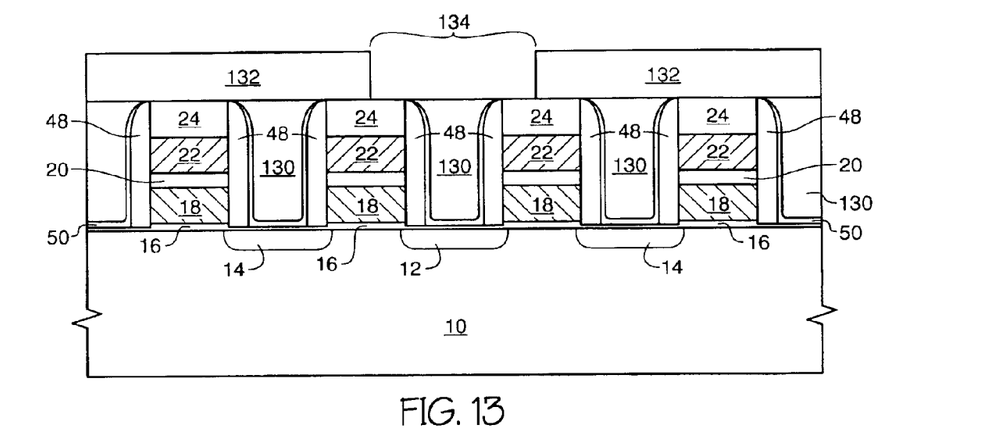
FIGS. 13–16 are cross sections depicting a second inventive embodiment of a method to form a source local interconnect.

A second embodiment of the inventive method is depicted in FIGS. 13–16. FIG. 13 depicts the following device structures: a semiconductor wafer 10, implanted transistor source 12 and drain 14 diffusion regions, gate oxide 16, a floating gate 18, capacitor dielectric 20, a control gate 22, and a capping layer 24, for example comprising silicon nitride (Si$_3$N$_4$). The source regions 12 can comprise an arsenic-doped or phosphorous-doped well implanted in the wafer to an implant dose of between about 1E13 to about 1E15 atoms/cm$^2$. As stated in reference to the prior embodiment, this is different from conventional flash devices which have a source implant level of greater than 1E15 up to about 1E16 atoms/cm$^2$. The lighter implant dose of the inventive source region allows the distance between flash cell source and drain to be decreased. This decrease in spacing between the source and drain allowed by this embodiment of the present invention results, in part, from the reduction of the number of implanted atoms diffusing away from the high concentration regions of conventional source regions into the channel region below the transistor stack. FIG. 13 further depicts dielectric spacers 48 and a thin (50 Å to 100 Å) nitride layer 50, each of which can be manufactured according to the prior embodiment, and the remainder of each transistor, specifically structures 10 and 14–24 can be obtained or manufactured by one of ordinary skill in the art.

After forming structures 10–50, a dielectric layer 130, for example a BPSG layer, is formed then planarized using an abrasive planarization technique such as CMP and stopping on the capping layer. While dielectric layer 130 is being planarized, it is possible to remove thin nitride layer 50 from over the nitride capping layers 24 as depicted, as well as part of the nitride capping layer. Subsequently a patterned photoresist layer 132 is provided which comprises an opening 134 located over the source region 12. An etch is performed to remove the exposed dielectric located over the source region 12 with a wet etch which only minimally etches capping layer 24 and nitride layer 50, and, if layer 50 is removed, spacer layer 48. With silicon nitride layer 50, spacers 48, and capping layer 24, a wet etch such as hydrofluoric acid (HF) diluted to about 25:1 water:HF for a duration of between about five minutes and about 10 minutes is selected because a wet etch, in general, provides for much higher BPSG etch rate relative to the nitride. Layers 132, 50, 48, and 24 protect the portion of the BPSG layer which is to remain, the transistor gate stack, and the source region 12. Thus, the BPSG over the source region can be removed with a highly selective wet etch without damaging the exposed gate oxide 16 under spacers 48.

After removing BPSG layer 130 and stopping on layer 50, layer 50 and gate oxide layer 16 are removed from over at least a portion of the transistor source to expose the source region. Removal of the etch-resistant layer 50 formed from nitride and the gate (tunnel) oxide layer 16 can be accomplished using an anisotropic dry etch. An exemplary etch includes CF$_4$ at a flow rate of about 90 sccm, argon at a flow rate of about 20 sccm, an RF power of about 400 watts, a pressure of about 30 mT for a duration of about 10 seconds to stop on the silicon wafer 10 once layers 50 and 16 are removed. Subsequent to this etch the source region 12 is exposed.

Figure 14:
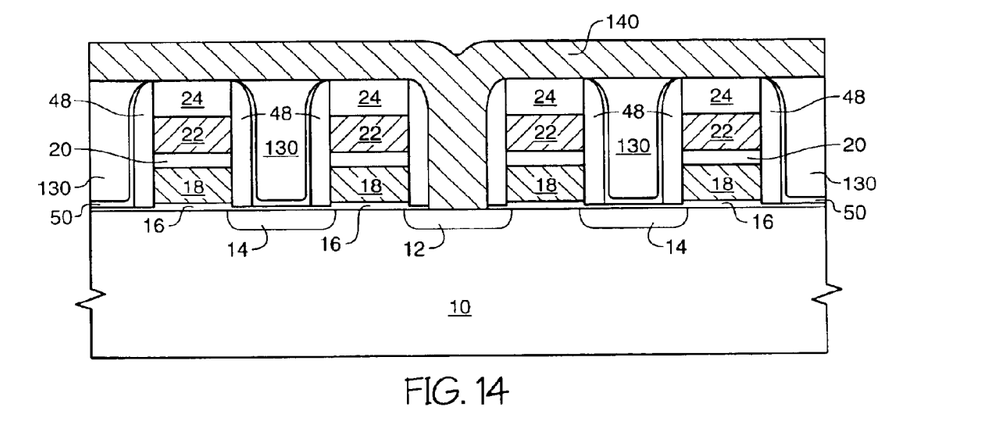

Next, a blanket conductive local interconnect layer is formed, for example from polysilicon 140 to result in the structure of FIG. 14. A layer of conductively-doped polysilicon between about 500 Å and about 2,000 Å may be formed by introducing silane gas (SiH$_4$) as a silicon source into the chamber at a flow rate of between about 400 sccm and about 600 sccm along with phosphine (PH$_3$) at a flow rate of between about 5 sccm and about 15 sccm at a temperature of between about 500° C. and about 600° C. for a duration of between about four hours and about 16 hours. Using this process the preferred material is formed at a rate of between about 10 Å/min to about 20 Å/min.

Figure 15:
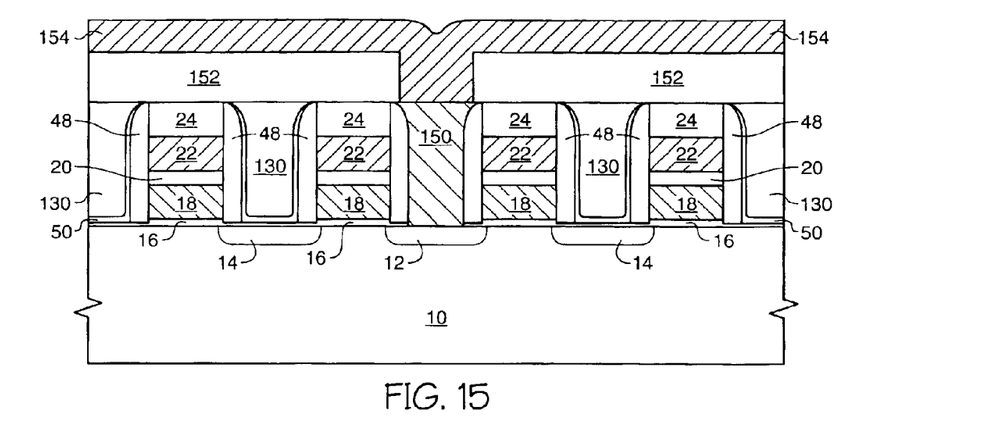
Figure 16:
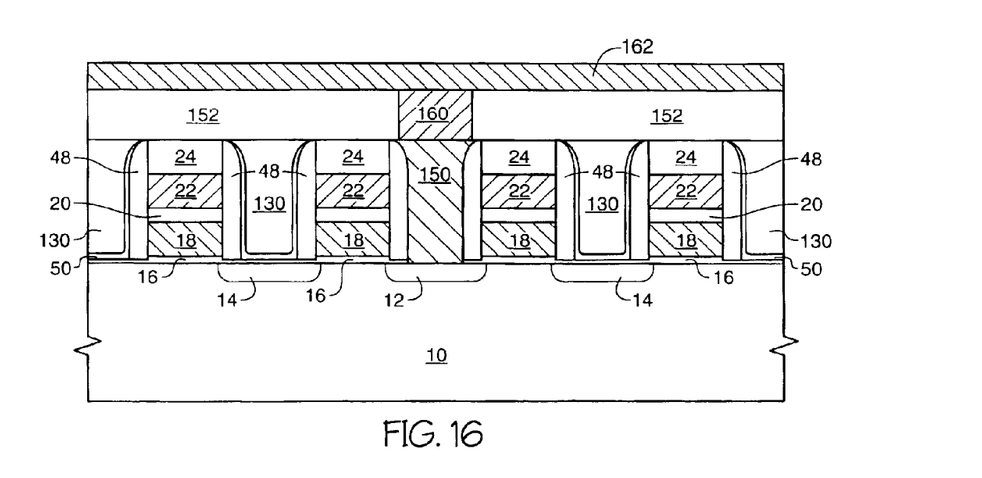

The polysilicon layer 140 (or other material used, for example tungsten) is planarized, for example using an abrasive planarization technique such as CMP, to result in the planarized polysilicon line 150 of FIG. 15. Subsequently, a patterned dielectric layer 152, for example BPSG, is formed, and a blanket conductive layer 154, for example tungsten, is formed to fill the opening in layer 152 as depicted. Layer 154 is then planarized to form a plurality of conductive plugs 160 in layer 152, one of which is depicted in FIG. 16. At least one plug 160 contacts each conductive line 150 which couples a plurality of source regions in a column of transistors. Next, a conductive line 162, for example aluminum, is patterned to contact plugs 150 across multiple columns of transistors, and thus electrically couple each source line within multiple columns of transistors of a sector.

A semiconductor device embodying the invention or manufactured using the inventive method has various uses in many electronic devices. For example an inventive device may be attached along with other devices to a printed circuit board, for example to a computer motherboard or as a part of a memory module used in a personal computer, a minicomputer, or a mainframe. The inventive device could further be useful in other electronic devices related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is further apparent to those of ordinary skill in the art that there are other device structures which have been omitted for simplicity of explanation of the invention. For example, a thin titanium layer may be formed prior to forming polysilicon layers 90 and 140 to enhance conductivity and adhesion between silicon wafer 10 and conductive lines 100 and 150. It is therefore contemplated that the appended claims will cover any such modifications or embodiments as fall within the true scope of the invention.

What is claimed is:

1. An in-process semiconductor device comprising:
   at least two columns of transistors within a single sector of a memory device, each transistor having a source region;
   a dielectric layer having an opening therein, said opening defined by first and second cross sectional sidewalls of said dielectric layer, wherein each said first and second sidewall overlies one said column of transistors;
   first and second dielectric spacers, wherein each said first and second spacer covers one said sidewall of said dielectric layer; and
   a conductive line partially formed between said two columns of transistors and partially formed in said opening in said dielectric layer between said first and second dielectric sidewalls, wherein said spacers separate said conductive line from physical contact with said dielectric layer, and wherein said conductive line electrically couples each said source region of each said transistor in each of said two columns of transistors.

2. The in-process semiconductor device of claim 1 wherein said dielectric layer is a first dielectric layer and said semiconductor device further comprises a second dielectric layer overlying and contacting said first dielectric layer, said second dielectric layer having an opening therein defined by first and second cross sectional sidewalls of said second dielectric layer, said first and second cross sectional sidewalls of said second dielectric layer being continuous with said first and second cross sectional sidewalls of said first dielectric layer, and wherein each said first and second spacer covers one said sidewall of said second dielectric layer, and wherein said conductive line is partially formed in said opening in said second dielectric layer between said first and second sidewalls of said second dielectric layer, and wherein said spacers separate said conductive line from physical contact with said second dielectric layer.

3. The in-process semiconductor device of claim 2 wherein each said transistor further comprises a dielectric capping layer.

4. The in-process semiconductor device of claim 3 wherein said second dielectric layer, said spacers covering said first and second sidewalls of said first dielectric layer, and said spacers covering said first and second sidewalls of said second dielectric layer each comprise silicon nitride.

5. An in-process semiconductor device comprising:
   at least a first transistor and a second transistor sharing a common source region, with each transistor comprising a control gate;
   a capping layer covering said first and second transistor control gates, said capping layer having a horizontally-oriented upper surface;
   a gate oxide layer extending from under said control gate of said first transistor control gate, to under said second transistor control gate;
   a first spacer contacting said first transistor control gate and a second spacer contacting said second transistor control gate;
   a blanket etch-resistant layer which contacts said gate oxide layer at a location between said first and second transistors, and which contacts said capping layer and said first and second spacers, and which overlies both said first and second transistor control gates;
   a dielectric layer which contacts said blanket etch-resistant layer at said location between said first and second transistors, said dielectric layer comprising:
      a first upper surface which is at a level below said horizontally-oriented upper surface of said capping layer;
      a second upper surface which is at a level above said horizontally-oriented upper surface of said capping layer;
      a first vertically-oriented sidewall which overlies said first transistor control gate; and
      a second vertically-oriented sidewall which overlies said second transistor control gate,
   wherein a portion of said etch-resistant layer between said first and second sidewalls is not covered by said dielectric layer.

6. The in-process device of claim 5 further comprising an unetched spacer layer which contacts said first and said second sidewalls and first upper surface of said dielectric layer.

7. The in-process device of claim 5 further comprising:
   a first spacer which contacts said first vertically-oriented sidewall of said dielectric layer; and
   a second spacer which contacts said second vertically-oriented sidewall of said dielectric layer,
   wherein said first upper surface of said dielectric layer is exposed.

8. An in-process semiconductor device comprising:
   a semiconductor wafer;
   at least a first word line which defines control gates for a plurality of transistors in a first column and a second word line which defines control gates for a plurality of transistors in a second column, each word line overlying said semiconductor wafer;
   a source diffusion region within said semiconductor wafer;
   a gate oxide layer which extends from under said first word line, across said source diffusion region, to under said second word line;
   a first spacer which contacts said first word line and a second spacer which contacts said second word line;

an etch-resistant layer which contacts said first spacer, said second spacer, and said gate oxide layer and which defines a recess over said source diffusion region;

a dielectric layer formed within said recess over said source diffusion region; and an etch mask having an opening therein which exposes said dielectric layer.

9. The in-process semiconductor device of claim 8 further comprising a plurality of floating gates with each floating gate associated with one of said plurality of transistors in said first and second columns of transistors.

10. The in-process semiconductor device of claim 8 further comprising a first capping layer on said first word line and a second capping layer on said second word line, wherein said etch-resistant layer does not contact at least a portion of an upper surface of said first and second capping layers.

11. The in-process semiconductor device of claim 8 further comprising:

first a drain diffusion region within said semiconductor wafer at a location lateral to said first word line and a second drain diffusion region within said semiconductor wafer at a location lateral to said second word line, wherein said source diffusion region is interposed between said first and second drain diffusion regions;

said dielectric layer formed at locations over said first and second drain diffusion regions; and said etch mask overlying said dielectric layer over said first and second drain diffusion regions such that said dielectric layer, at said locations over said first and second drain diffusion regions, is not exposed.

* * * * *